United States Patent
Waters et al.

(10) Patent No.: US 9,056,767 B2
(45) Date of Patent: Jun. 16, 2015

(54) DYNAMIC ACCESS POINT BASED POSITIONING

(71) Applicant: TEXAS INSTRUMENTS INCORPORATED, Dallas, TX (US)

(72) Inventors: Deric Wayne Waters, Dallas, TX (US); Ariton E. Xhafa, Plano, TX (US); Mohamed Farouk Mansour, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 176 days.

(21) Appl. No.: 13/852,073

(22) Filed: Mar. 28, 2013

(65) Prior Publication Data

US 2014/0171108 A1    Jun. 19, 2014

Related U.S. Application Data

(60) Provisional application No. 61/618,299, filed on Mar. 30, 2012.

(51) Int. Cl.
| | |
|---|---|
| H04W 24/00 | (2009.01) |
| B81C 1/00 | (2006.01) |
| B81B 7/00 | (2006.01) |
| H04W 4/02 | (2009.01) |
| H01L 21/02 | (2006.01) |
| B81B 3/00 | (2006.01) |

(52) U.S. Cl.
CPC ............. *B81C 1/0096* (2013.01); *B81B 7/0032* (2013.01); *B81C 1/00261* (2013.01); *H04W 4/02* (2013.01); *Y10S 257/914* (2013.01); *H01L 21/02112* (2013.01); *Y02B 60/50* (2013.01); *B81B 3/0005* (2013.01)

(58) Field of Classification Search
CPC ......... H04W 4/02; H04W 4/04; H04W 48/04; H04W 64/00
USPC ................. 455/456.1, 456.2, 404.2
See application file for complete search history.

(56) References Cited

U.S. PATENT DOCUMENTS

| | | | |
|---|---|---|---|
| 2002/0025810 A1* | 2/2002 | Takayama et al. ............ | 455/432 |
| 2010/0303051 A1* | 12/2010 | Umeuchi et al. .............. | 370/338 |
| 2011/0301912 A1* | 12/2011 | Pandey et al. ................. | 702/150 |
| 2011/0317579 A1* | 12/2011 | Jones et al. ................... | 370/252 |
| 2012/0063340 A1* | 3/2012 | Waters et al. ................. | 370/252 |
| 2013/0155933 A1* | 6/2013 | Kneckt et al. ................ | 370/312 |

* cited by examiner

*Primary Examiner* — Khalid Shaheed
*Assistant Examiner* — Shantell L Heiber
(74) *Attorney, Agent, or Firm* — Steven A. Shaw; Frank D. Cimino

(57) ABSTRACT

A wireless device that includes an access point (AP) scanner, a transceiver, and a controller coupled to the AP scanner and transceiver. The AP scanner is configured to scan wireless network channels utilized by one or more APs to transmit data packets, probe responses, and beacons. The transceiver is configured to transmit one or more probe requests to the one or more APs and receive one or more probe responses and beacons from the one or more APs. The controller is configured to determine a proximate geographic position of the wireless device based on signal strength of the one or more probe responses and beacons received from the one or more APs. The controller also dynamically adapts a parameter utilized in determining the proximate geographic position of the wireless device.

20 Claims, 2 Drawing Sheets

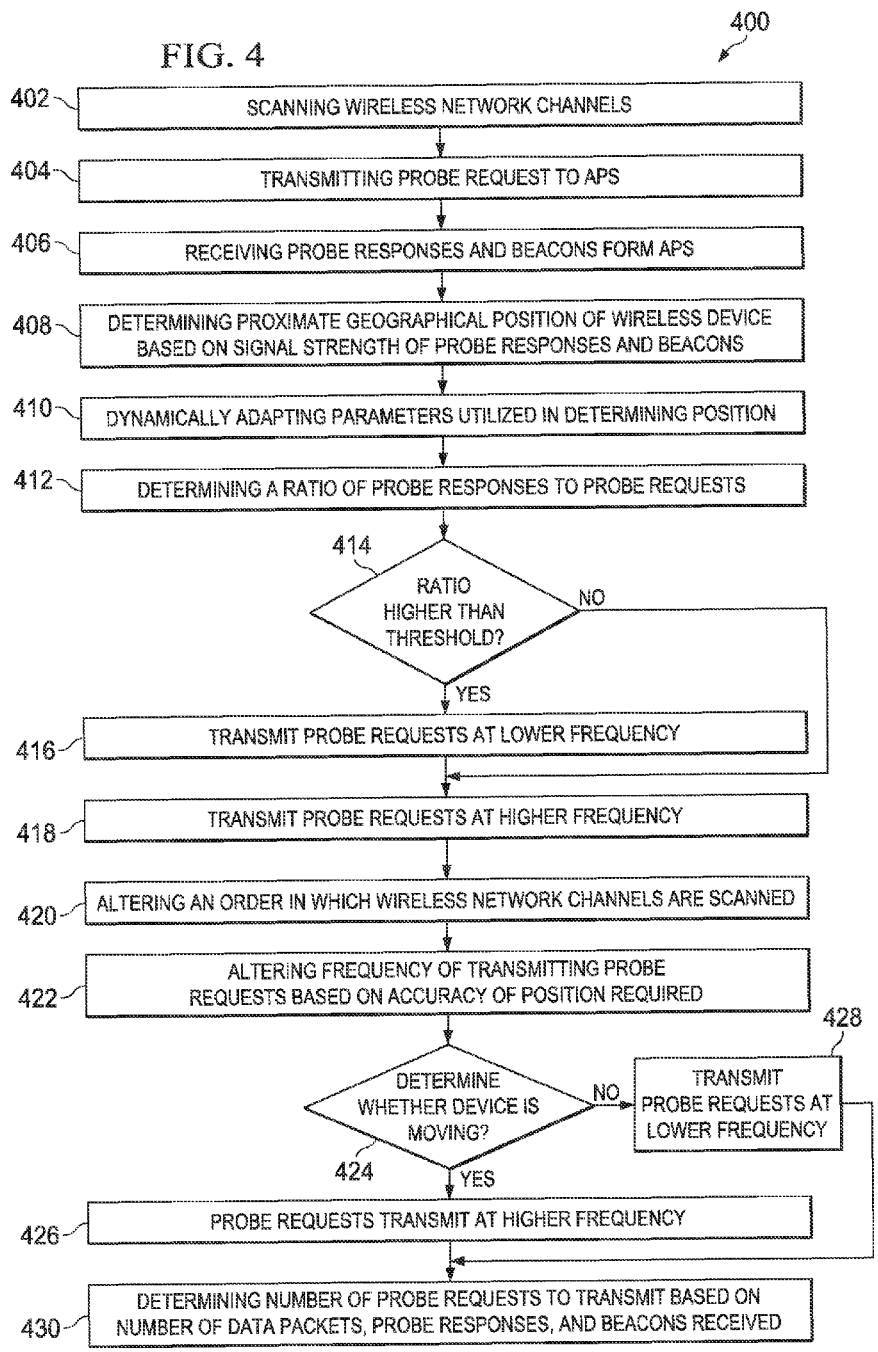

DYNAMIC ACCESS POINT BASED POSITIONING

CROSS-REFERENCE TO RELATED APPLICATION

The present application claims priority to U.S. Provisional Patent Application No. 61/618,299, filed on Mar. 30, 2012; which is hereby incorporated herein by reference in its entirety.

BACKGROUND

As mobile devices proliferate, the demand for services tailored to device location also increases. Location based services depend on positioning systems to determine device location. Satellite based position systems, such as the global positioning system (GPS), GLONASS, and Galileo can provide high accuracy, but require a clear line of sight between the satellites and the mobile device to provide a position determination. Consequently, satellite positioning systems are largely ineffective for indoor positioning. Satellite positioning also requires specialized receivers that may increase the cost of the mobile device.

As an alternative or an augmentation to satellite based positioning, wireless network based positioning systems have been developed. For example, wireless local area network (WLAN) based positioning systems are suitable for indoor positioning and require minimal investment because they make use of existing infrastructure. Furthermore, many mobile wireless devices include support for communication via wireless networks. Wireless network based positioning systems determine mobile device position based on the established positions of wireless access points visible to the device and the strength of signals exchanged between the mobile device and the access points.

SUMMARY

The problems noted above are solved in large part by systems and methods for dynamic access point positioning. In some embodiments, a wireless device includes an access point (AP) scanner, a transceiver, and a controller coupled to the AP scanner and transceiver. The AP scanner is configured to scan wireless network channels utilized by one or more APs to transmit data packets, probe responses, and beacons. The transceiver is configured to transmit one or more probe requests to the one or more APs and receive one or more probe responses and beacons from the one or more APs. The controller is configured to determine a proximate geographic position of the wireless device based on signal strength of the one or more probe responses and beacons received from the one or more APs. The controller also dynamically adapts a parameter utilized in determining the proximate geographic position of the wireless device.

Another illustrative embodiment includes a wireless access point (AP) that comprises a transceiver and a controller coupled to the transceiver. The transceiver is configured to transmit one or more data packets, probe responses, and beacons. The transceiver is also configured to receive one or more probe requests. The controller is configured to cause the transceiver to transmit a number of beacons based on a number of probe requests received.

Yet another illustrative embodiment is a method that includes scanning, by a wireless device, wireless network channels utilized by one or more access points (AP) to transmit data packets, probe responses, and beacons. The wireless device also transmits one or more probe requests to the one or more APs. The method also includes receiving, by the wireless device, one or more probe responses and beacons from the one or more APs. The method continues with the determining a proximate geographic position of the wireless device based on signal strength of the one or more probe responses and beacons received from the one or more APs. The method further includes dynamically adapting parameters utilized in determining the proximate geographic position of the wireless device.

BRIEF DESCRIPTION OF THE DRAWINGS

For a detailed description of exemplary embodiments of the invention, reference will now be made to the accompanying drawings in which:

FIG. 4 shows a flow diagram of wireless network positioning method for a wireless mobile device in accordance with various embodiments;

NOTATION AND NOMENCLATURE

Figure 1:
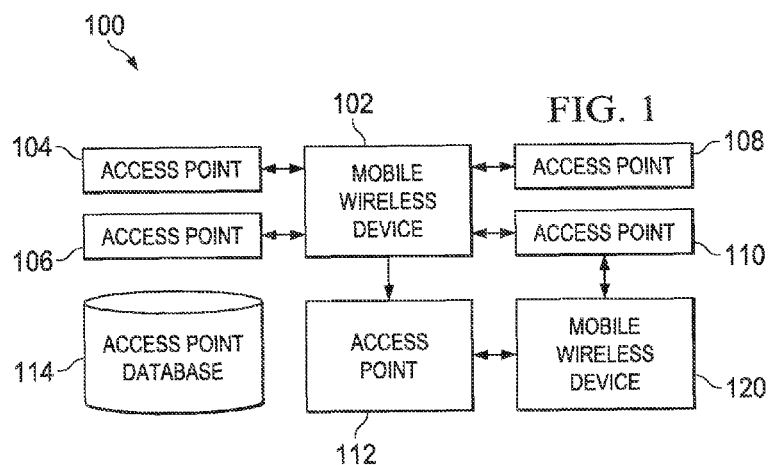
FIG. 1 shows a block diagram of a system for using wireless network access points to determine the position of a wireless device in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections. Further, the term "software" includes any executable code capable of running on a processor, regardless of the media used to store the software. Thus, code stored in memory (e.g., non-volatile memory), and sometimes referred to as "embedded firmware," is included within the definition of software. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Wireless network based positioning systems are increasingly becoming more common for determining a position for wireless devices usually in inside areas as other systems, such as GPS, may not be available. Wireless network based systems enable wireless mobile devices the capability of determining their geographic positions utilizing the wireless network. Typically, the mobile devices employ strategies that attempt to minimize any positioning error and power consumption. As more and more mobile devices utilize these systems, the individual strategies utilized to minimize error and power consumption may in fact cause the system as a whole to become less efficient. A system that dynamically adapts parameters that are utilized in determining the proximate geographic position of the mobile device allows the device to consume less power and become more accurate than a static system.

Some parameters that may dynamically adapt to reduce power consumption and increase accuracy of the system include the frequency at which probe requests are transmitted from the mobile wireless device to a wireless network access point and the order and start time for wireless network channel scanning. The frequency in which probe requests are transmitted from the mobile device to the access point may be based on a ratio of probe responses received from the access point to the number of probe requests transmitted by the mobile device; the level of accuracy required by the mobile device; a determination of whether the mobile device has moved or not; and the number of data packets, probe responses, and beacons received by the mobile device even if those data packets, probe responses, and beacons are directed to other mobile devices.

FIG. 1 shows a block diagram of a system 100 for using wireless network access points to determine the position of a wireless device in accordance with various embodiments. The system 100 includes a mobile wireless device 102 and a plurality of wireless network access points (APs) 104-112. In an embodiment APs 104-112 are configured as wireless local area network (WLAN) access points. The mobile wireless device 102 is positioned to wirelessly communicate with one or more of the APs 104-112 each associated with a WLAN (e.g., a network in accordance with one or more the IEEE 802.11 standards). In the embodiment of FIG. 1, the mobile wireless device 102 is positioned to receive transmissions from and/or communicate with any of the APs 104-112. Mobile wireless device 120 is positioned to wirelessly communicate with one or more of APs 110 and 112. The mobile wireless devices 102 and 120 may be a cellular telephone, a tablet computer, or any other mobile computing device configured for WLAN access.

The system 100 also includes a database 114 that stores and provides access point location information in response to a positioning information query. In various embodiments, the database 114 is stored on a mobile device (e.g. mobile device 102). In some embodiments of the system 100, the database 114 is accessed through the WLAN. The mobile wireless device 102 executes a scan for APs and provides AP identification and other information (e.g., a medium access controller (MAC) address and/or signal strength measurement) to the database 114. The database 114 may provide AP position information or device 102 position information to the device 102 responsive to the AP identification and associated information provided by the device 102.

The mobile wireless device 102 can actively or passively scan for APs. The MAC address of an AP is carried in the physical layer (PHY) payload, so the wireless device cannot identify an AP based on the preambles of received packets. When executing an active scan, the mobile wireless device 102 transmits a probe request on a selected WLAN channel, waits at least a predetermined interval for a probe response, and may transmit an acknowledgement to each AP that responds. Thereafter, the mobile wireless device 102 may select a new network channel and repeat the operations listed above. If the probe request is transmitted using IEEE 802.11b, the range of the probe request is extended allowing reception by more distant APs, but the packet duration is longer than if transmitted using IEEE 802.11a.

Advantages of active scanning include a reduction in scanning time, and corresponding reduction in scanning related power consumption if APs respond quickly to the probe request. Disadvantages of active scanning include the power consumed by probe requests and acknowledgement transmissions, and increased network traffic that may result in collisions and increased latency.

When executing a passive scan, the mobile wireless device 102 listens for beacon frames transmitted by the APs on a selected channel. After listening to the channel for a predetermined interval, the device 102 changes channels and continues listening. Each received beacon frame is processed to extract an AP MAC address, and beacon transmission interval. A typical beacon transmission frequency may be about 10 hertz (HZ).

Advantages of passive scanning include no need for extra transmissions (e.g., probe requests, responses, etc.) by the device 102 or APs, and if the AP downlink range is greater than the device 102 uplink range, then the device 102 may be able to identify APs that are beyond device 102 transmission range. Disadvantages of passive scanning include the need to listen for a maximum beacon interval to identify all APs, and the need to scan channels using multiple modulation modes (e.g., DSSS for 802.11b and OFDM for 802.11a).

Figure 2:
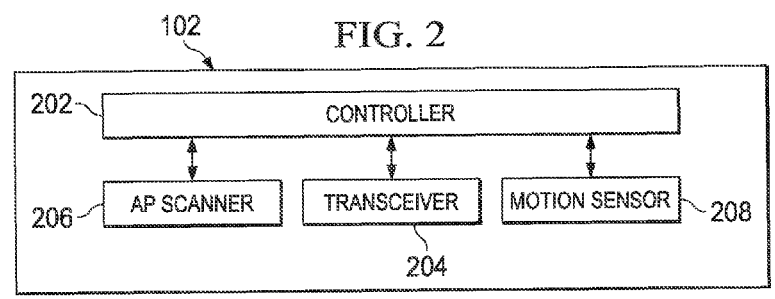
FIG. 2 shows a block diagram of a mobile device configured to perform wireless network positioning by scanning for wireless access points in accordance with various embodiments.

FIG. 2 shows a block diagram of the mobile wireless device 102 configured to perform wireless network positioning by scanning for wireless APs in accordance with various embodiments. The mobile device 102 may include a controller 202, a transceiver 204, an AP scanner 206, and/or a motion sensor 208. In an embodiment, the transceiver 204, AP scanner 206, and motion sensor 208 are coupled to the controller 202. In an embodiment, AP scanner 206 may be implemented by the controller 202.

The transceiver 204 provides an interface through which the device 102 accesses the wireless medium to communicate with one or more of the APs 104-112. The transceiver 204, thus, may transmit probe requests to the APs 104-112 which then may elicit a probe response from the APs 104-112. In addition to receiving probe responses from the APs 104-112, the transceiver 204 also may receive beacons and other data packets from the APs 104-112. The AP scanner 206 is configured to identify APs proximate to the wireless device 102 for use in wireless network based position determination. The wireless device 102 may also include a motion sensor 214, that may include an accelerometer, gyroscope, etc. which is configured to detect when the wireless device 102 has moved.

The controller 202 can coordinate and, in some embodiments, directly control the various activities of the device 102 including the activities of the transceiver 204, AP scanner 206, and motion sensor 208. The controller 202 accesses the AP database 114 to provide and/or retrieve AP information, such as AP location information. The AP database 114 may reside in the wireless device or on a network server or storage device. The wireless device 102 may also retain at least a portion of the AP database locally and update the local portion from the server occasionally.

The controller 202 is configured to implement a variety of techniques that optimize efficiency and power consumption during the determination of geographic position of the mobile device 102. In some embodiments, the controller 202 acquires and applies information indicating the wireless network channels most likely to be used by APs proximate to the wireless device 102. The controller 202 may access the AP database 114 to retrieve information regarding what network channels are being used by APs proximate to the wireless device 102, and cause AP scanner 206 to scan only those channels that the AP may utilize to transmit data packets, probe responses, and beacons. For example, the AP scanner 206 may only scan three channels of an available sixteen channels available because the proximate APs only utilize those three channels to transmit data packets, probe responses, and beacons.

Because the controller 202 has access to each of APs 104-112 location found in database 114, controller 202 may determine the proximate geographic position of the wireless device 102 based on the signal strength, which may be termed the received signal strength indicator (RSSI), of probe responses, beacons, and data packets received by transceiver 204 from APs 104-112. The controller 202 need simply triangulate the position after first estimating its range to the APs 104-112 based on the signal strength.

In an alternative embodiment, position of mobile device 102 may be determined through a process that may be termed "fingerprinting". In fingerprinting, the APs' 104-112 position are not known by mobile device 102. Instead, the RSSIs of the APs 104-112, as seen from specific locations, are stored in data base 114 for many locations. This may be thought of in terms of grid points in a room. For each grid point, the data base 114 may store the RSSI that should be seen from that grid point. Then, the set of RSSIs measured by the mobile device 102 may be compared to those from the different grid points. The mobile device 102 is located between the best matched grid points.

Embodiments of the mobile device 102 may reduce power consumption by dynamically adapting parameters utilized in determining the proximate geographic position of the wireless device. The parameters utilized in determining the proximate geographic position of mobile device 102 include the frequency of probe requests transmitted by mobile device 102 to APs 104-112 and the wireless network channels to be scanned.

In an embodiment, controller 202 may make a determination of the number of free RSSI measurements received from APs 104-112 during a scan. A free measurement is based on the reception of beacons or probe responses from any of APs 104-112 that were destined for a separate wireless device, such as wireless device 120. The predicted number of free measurements in the next scan may be computed utilizing the following equation:

$$\overline{N}_f(i+1) = \overline{N}_f(i)a + N_f(i)(1-a) \quad (1)$$

where $N_f(i)$ is the number of free measurements received during the i-th scan, $\overline{N}_f(0)$ is equal to 0, and the filter coefficient a depends on the relative values of $\overline{N}_f(i)$ and $N_f(i)$. More specifically, if $\overline{N}_f(i) > N_f(i)$, then a, in an embodiment, may equal to 0.125, otherwise, a may equal to 0.5. By having a lower value a when $\overline{N}_f(i) > N_f(i)$, the wireless device 102 is protected from overestimating the number of free measurements it will receive which might reduce performance. In alternative embodiments, $\overline{N}_f(i+1)$, the predicted number of free measurements for a future scan, may be predicted using advanced signal processing techniques, e.g. linear prediction.

In an embodiment, controller 202 determines a ratio of the number of probe responses received over a specified time interval by the transceiver 204 from the APs 104-112 to the number of probe requests transmitted over the same specified time interval by the transceiver 204 to the APs 104-112. More specifically, the probability of a successful probe request, the probability that a probe request will be received by one of APs 104-112 and a probe response transmitted back to controller 202, may be approximated by the following equation:

$$P_s(i) = \min(1, N_{ApResp}(i)/N_r(i)) \quad (2)$$

where Ps(i) is the probability that a probe request is successful, min (a, b) is the minimum of a and b, $N_{ApResp}(i)$ is the highest number of RSSI measurements obtained from any single one of APs 104-112 during the i-th scan, and $N_r(i)$ is the maximum number of probe requests allowed during this i-th scan. Further, the predicted probability that a probe request will be successful for a future scan, the (i+1) scan, is approximated utilizing the following equation:

$$\overline{P}_S(i+1) = \overline{P}_S(i)b + P_S(i)(1-b) \quad (3)$$

where b may be equal to 0.5 and $\overline{P}_S(0)$ is equal to 0.

This ratio indicates the quality of the wireless connection between the mobile device 102 and the APs 102-104 because it indicates the percentage of probe requests that initiate a probe response. The closer the ratio is to one, the higher the quality of the wireless connection. The higher the quality of the connection, the lower the amount of probe requests that need to be made to receive a certain number of probe responses that may be used to determine geographic position of mobile device 102. Thus, controller 202 may cause transceiver 204 to transmit probe requests less frequently when the ratio is higher than a preset threshold value and to transmit probe requests more frequently when the ratio is lower than a preset threshold value.

In an embodiment, parameters for future scans may be set utilizing the following equation:

$$N_r(i+1) = \max(1, \text{ceil}[N_r - \overline{N}_f(i)]) \quad (4)$$

$$f(i+1) = q_T/(N_r \overline{P}_S(i)) \quad (5)$$

Where $N_r(i+1)$ is the number of probe requests to send in the (i+1)-th scan, $N_r$ is the maximum number of probe requests that may be transmitted by wireless device 102 to APs 104-112 during any single scan such that $N_r \geq N_r(i)$, ceil(x) is the smallest integer greater than x, max (a,b) is the maximum of a and b, 1/ f(i+1) is the number of seconds between the i-th and (i+1)-th scan, and $q_T$ is the number of RSSI measurements per AP 104-112 required to meet a target performance.

In an embodiment, controller 202 causes the AP scanner 206 to alter the start time and/or the order for each of its scans of the wireless network channels and causes the transceiver 204 to alter the start time and/or order in which it transmits probe responses through each of the wireless network channels. For example, the AP scanner 206 may scan each of three wireless network channels every 100 ms. Instead of starting the scan at time 0 ms, 100 ms, 200 ms, etc., AP scanner 206 might start the scan at 0 ms, 98 ms, 202 ms, etc. Additionally, instead of scanning the wireless network channels in the same order each time, say channels 3, 8, and 16 in that order, AP scanner 206 may alter the order such that it scans channels 3, 8, and 16 in order the first scan and then during the subsequent scan in a different order, say 16, 8, and 3. Thus, if mobile device 120 is also transmitting and receiving probe requests and probe responses on the exact same wireless network channels, at the same time, and at the same frequency, then, by altering the start time/order of scanning or transmitting probe requests, mobile device 102 is less likely to continue scanning and/or transmitting at the same time as mobile device 120.

In an embodiment, controller 202 causes the transceiver 204 to alter the frequency in which the probe requests are transmitted to the APs 104-112 based on the level of accuracy required by mobile device 102 for its geographic position. For example, if the mobile device 102 requires a very precise geographic position, the controller 202 may cause the transceiver 204 to transmit more probe requests to the APs 104-112, thus increasing accuracy of the geographic position of mobile device 102. However, if the mobile device 102 requires a less precise geographic position, the controller 202 may cause the transceiver 204 to transmit fewer probe requests to the APs 104-112, thus, lowering power consumption in mobile device 102.

As noted above, the wireless device 102 may also include a motion sensor 208, incorporating an accelerometer, gyroscope, etc. In an embodiment, the controller 202 is coupled to the motion sensor 208 and may cause the transceiver 204 to alter the frequency in which the probe requests are transmitted to the APs 104-112 based on an output of the motion sensor 208 indicating whether the mobile device 102 has moved significantly since a previous geographic position determination had been made. In an embodiment, a significant movement for mobile device 102 is a movement of 1 meter or multiple human steps. In another embodiment, a significant movement for mobile device 102 is based on the reception of beacons and/or probe responses from different APs. For example, if the motion sensor 208 determines that the mobile device 102 has not significantly moved, the controller 202 may cause the transceiver 204 to transmit probe requests less frequently to the APs 104-112, thus, lowering power consumption in mobile device 102. However, if the motion sensor 208 determines that the mobile device 102 has significantly moved, the controller 202 may cause the transceiver 204 to transmit probe requests more frequently to the APs 104-112, thus, increasing the accuracy of the geographic position as the mobile device 102 has moved since the last geographic position determination.

In an embodiment, the controller 202 causes the transceiver 204 to receive probe responses, beacons, and data packets transmitted by APs 104-112 even in the event that the probe responses, beacons, and data packets are directed to another wireless device, such as mobile device 120. The controller 202 then may determine how many probe requests to transmit based on the number of data packets, probe responses, and beacons received by transceiver 204. By receiving probe requests, data packets, and beacons directed to other wireless devices, mobile device 102 may transmit fewer probe requests as it is already receiving information that it requires to determine its geographic position (i.e. signal strength of the data received from the APs 104-112). Thus, controller 202 may determine the number of probe responses, beacons, data packets received that were directed to any wireless device and base the number of probe responses transceiver 204 is to transmit off of that number. The more probe responses, beacons, data packets received, the lower the frequency of probe responses transmitted. Similarly, the fewer the probe responses, beacons, data packets received, the higher the frequency of probe responses transmitted.

Various components of the wireless device 102 including at least some portions of the controller 202 can be implemented using a processor executing software programming that causes the processor to perform the operations described herein. Suitable processors include, for example, general-purpose microprocessors, digital signal processors, and microcontrollers. Processor architectures generally include execution units (e.g., fixed point, floating point, integer, etc.), storage (e.g., registers, memory, etc.), instruction decoding, peripherals (e.g., interrupt controllers, timers, direct memory access controllers, etc.), input/output systems (e.g., serial ports, parallel ports, etc.) and various other components and sub-systems. Software programming that causes a processor to perform the operations disclosed herein can be stored in a computer readable storage medium. A computer readable storage medium comprises volatile storage such as random access memory, non-volatile storage (e.g., a hard drive, an optical storage device (e.g., CD or DVD), FLASH storage, read-only-memory, or combinations thereof.

Some embodiments can implement portions of the wireless device 102 using dedicated circuitry (e.g., dedicated circuitry implemented in an integrated circuit). Some embodiments may use a combination of dedicated circuitry and a processor executing suitable software. For example, some portions of the controller 202 may be implemented using a processor or hardware circuitry. Selection of a hardware or processor/software implementation of embodiments is a design choice based on a variety of factors, such as cost, time to implement, and the ability to incorporate changed or additional functionality in the future.

Figure 3:
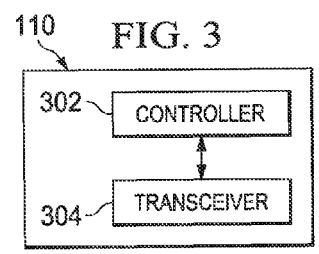
FIG. 3 shows a block diagram of a wireless access point in accordance with various embodiments.

FIG. 3 shows a block diagram of a wireless access point (AP) 110 in accordance with various embodiments. AP 110 may include a controller 302 and a transceiver 304. The transceiver 304 provides an interface through which the AP 110 accesses the wireless medium to communicate with one or more of the mobile wireless devices 102 and 120. The transceiver 304, thus, may transmit probe responses in response to a probe request, data packets, and beacons to the mobile devices 102 and 120.

Controller 302 causes the transceiver to transmit the probe responses, data packets, and beacons to the mobile devices 102 and 120. Probe responses are transmitted in response to a probe request transmitted by the mobile devices 102 and/or 120. As noted above, probe responses, beacons, and data packets all provide a signal strength to mobile devices 102 and 110, and thus, can be used to determine the geographic position for the devices. Furthermore, if the mobile devices 102 and 120 transmit fewer probe requests, power consumption in the mobile devices 102 and 120 as well as network traffic may be reduced. Therefore, in an embodiment, AP 110 may transmit more beacons to reduce the need for mobile devices 102 and 120 to transmit probe requests.

In an embodiment, the number of beacons transmitted by AP 110 is based on the number of probe requests received. The controller 302 may cause the transceiver 304 to transmit beacons more frequently whenever the number of probe requests received by AP 110 is higher than a preset threshold value. This allows the mobile device 102 and 120 to receive more packets to determine geographic position without having to continue transmitting a higher than normal number of probe requests. Similarly, the controller 302 may cause the transceiver 304 to transmit beacons less frequently whenever the number of probe requests received by AP 110 is lower than a preset threshold value.

In an embodiment, beacon frames transmitted may be shortened. That is, controller 302 may cause transceiver 304 to transmit an abbreviated beacon frame. Because the mobile device 102 and/or 120 only requires the signal strength, and does not require the remaining data found in a typical beacon, in order to determine its geographic position, the AP 110 may only transmit a beacon that does not contain all of the data found in a typical beacon. This saves in power consumption and network traffic overhead. Additionally, the controller 302 may cause the transmitter 304 to transmit probe responses, beacons, and data packets as broadcast data packets instead of unicast data packets. By transmitting broadcast packets, all wireless devices, including mobile devices 102 and 120, would be able to receive the packet without being specially configured for eavesdropping instead of only the device the packet is directed towards. As noted above, this may allow for lower power consumption in mobile devices 102 and 120.

FIG. 4 shows a flow diagram of wireless network positioning method 400 for a wireless mobile device 102 and/or 120 in accordance with various embodiments. Though depicted sequentially as a matter of convenience, at least some of the actions shown can be performed in a different order and/or performed in parallel. Additionally, some embodiments may perform only some of the actions shown. In some embodiments, at least some of the operations of the method 400, as well as other operations described herein, can be performed by the controller 202 and implemented by a processor executing instructions stored in a non-transitory computer readable storage medium.

The method 400 begins in block 402 with scanning the wireless network channels utilized by the APs 104-112 to transmit data packets, probe responses, and beacons. In block 404, the method 400 continues with transmitting probe requests, by the wireless device 102, to the APs 104-112. In block 406, the wireless device 102 receives the probe responses, beacons, and/or data packets from the APs 104-112. In block 408, the method 400 continues with determining a proximate geographic position of the wireless device based on a signal strength of the probe responses, beacons, and/or data packets received from the APs 104-112. This may be accomplished through triangulation after first estimating the range from the mobile device 102 to the APs 104-112 based on the signal strength.

In block 410, the method 400 continues with dynamically adapting parameters utilized in determining the proximate geographic position of mobile device 102. The parameters utilized in determining the proximate geographic position of mobile device 102 may include the frequency of probe requests transmitted by mobile device 102 to APs 104-112 and the order and start time of wireless network channels to be scanned.

In block 412, the method 400 continues with determining a ratio of the number of probe responses transmitted by APs 104-112 to the mobile device 102 to the number of probe requests transmitted by the mobile device 102 to APs 104-112. In block 414, a determination is made as to whether the ratio of the number of probe responses transmitted by APs 104-112 to the mobile device 102 to the number of probe requests transmitted by the mobile device 102 to APs 104-112 is higher than a predetermined threshold value. If the determination made is that the ratio is higher than the predetermined threshold value, then the mobile device 102 lowers the frequency of probe requests transmitted to the APs 104-112, as shown in block 416. In block 418, if the ratio is determined to be lower than a predetermined threshold value, then the mobile device 102 raises the frequency of probe requests transmitted to the APs 104-112.

In block 420, the method 400 continues with altering an order in which the wireless network channels are scanned. In block 422, the method 400 continues with altering the frequency of transmitting probe requests based on the accuracy of the geographic position required by the mobile device 102. If the accuracy is required to be high, then mobile device 102 transmits probe requests more frequently while if the accuracy need not be high, then mobile device 102 transmits probe requests less frequently.

In block 424, the method 400 continues with a determination made as to whether mobile device 102 is moving. In block 426, if the determination is made that the mobile device 102 is moving, then the mobile device 102 transmits probe requests at a higher frequency. However, if the determination is made that the mobile device 102 is not moving, then the mobile device 102 transmits probe requests at a lower frequency.

In block 426, the method 400 continues with determining a number of probe requests to transmit based on the number of data packets, probe responses, and beacons received by mobile device 102 from APs 104-112 even if the data packets, probe responses, and beacons are directed to other wireless devices, such as mobile device 120. The more data packets, probe responses, and beacons received by mobile device 102 from APs 104-112, the lower the frequency of probe requests that need be transmitted by mobile device 102 to APs 104-112.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A wireless device, comprising:
   an access point (AP) scanner configured to scan wireless network channels utilized by one or more APs to transmit data packets, probe responses, and beacons;
   a transceiver configured to transmit one or more probe requests to the one or more APs and receive one or more probe responses and beacons from the one or more APs; and
   a controller coupled to the AP scanner and transceiver configured to:
      determine a proximate geographic position of the wireless device based on a signal strength of the one or more probe responses and beacons received from the one or more APs;
      determine a ratio of probe responses received from the one or more APs to probe requests transmitted to the one or more APs; and
      cause the transceiver to lower the frequency of probe requests based on the ratio being higher than a preset threshold value and raise the frequency of probe requests based on the ratio being lower than a preset threshold value,
   wherein the controller dynamically adapts a parameter utilized in determining the proximate geographic position of the wireless device.

2. The system of claim 1, wherein the controller causes the AP scanner to alter a start time to scan the wireless network channels.

3. The system of claim 1, wherein the controller causes the AP scanner to alter an order in which the wireless network channels are scanned.

4. The system of claim 1, wherein the controller causes the transceiver to alter a frequency in which the probe requests are transmitted based on a level of accuracy required by the wireless device for geographic position.

5. The system of claim 1, further comprising a motion sensor configured to determine whether the wireless device is moving, wherein the controller causes the transceiver to transmit probe requests at a lower frequency based on the motion sensor determining that the wireless device is not moving and to transmit probe requests at a higher frequency based on the motion sensor determining that the wireless device is moving.

6. The system of claim 1, wherein the one or more probe responses and beacons received comprises probe responses and beacons received from the one or more APs even if the one or more probe responses and beacons are directed to a separate wireless device.

7. The system of claim 6, wherein the controller is further configured to determine a number of probe requests to be transmitted based on a number of data packets, probe responses, and beacons received by the transceiver.

8. The system of claim 1, wherein the controller is further configured to:
predict the number of free received signal strength indicator (RSSI) measurements; and
cause the transceiver to decrease the number of probe requests transmitted to the one or more APs based on the predicted number of free RSSI measurements being greater than or equal to 1.

9. The system of claim 1, wherein the controller is further configured to:
predict the probability of a successful probe request; and
cause the transceiver to scan for APs more frequently when the predicted probability is lower than a preset threshold value.

10. A wireless access point (AP), comprising:
a transceiver configured to transmit one or more data packets, probe responses, and beacons and receive one or more probe requests; and
a controller coupled to the transceiver configured to:
cause the transceiver to transmit a number of beacons based on a number of probe requests received;
determining a ratio of probe responses received to probe requests transmitted; and
transmitting a lower frequency of probe requests based on the ratio being higher than a preset threshold value and a higher frequency of probe requests based on the ratio being lower than a preset threshold value.

11. The system of claim 10, wherein the controller causes the transceiver to transmit beacons more frequently based on the number of probe requests being higher than a preset threshold value.

12. The system of claim 10, wherein the controller causes the transceiver to transmit beacons less frequently based on the number of probe requests being lower than a preset threshold value.

13. The system of claim 10, wherein the beacon comprises an abbreviated beacon frame.

14. The system of claim 10, wherein the probe responses comprise a broadcast data packet.

15. A method comprising:
scanning, by a wireless device, wireless network channels utilized by one or more access points (AP) to transmit data packets, probe responses, and beacons;
transmitting, by the wireless device, one or more probe requests to the one or more APs;
receiving, by the wireless device, one or more probe responses and beacons from the one or more APs;
determining a proximate geographic position of the wireless device based on a signal strength of the one or more probe responses and beacons received from the one or more APs
determining a ratio of probe responses received from the one or more APs to probe requests transmitted to the one or more APs; and
transmitting, by the wireless device, a lower frequency of probe requests based on the ratio being higher than a preset threshold value and a higher frequency of probe requests based on the ratio being lower than a preset threshold value; and
dynamically adapting a parameter utilized in determining the proximate geographic position of the wireless device.

16. The method of claim 15, further comprising altering an order in which the wireless network channels are scanned.

17. The method of claim 15, further comprising altering frequency in which the probe requests are transmitted based on a level of accuracy required by the wireless device for geographic position.

18. The method of claim 15, further comprising:
determining whether to wireless device is moving;
transmitting a lower frequency of probe requests based on a determination that the wireless device is not moving; and
transmitting a higher frequency of probe requests based on a determination that the wireless device is moving.

19. The method of claim 15, wherein the one or more probe responses and beacons received comprises probe responses and beacons received from the one or more APs even if the one or more probe responses and beacons are directed to a separate wireless device.

20. The method of claim 19, further comprising determining a number of probe requests to be transmitted based on a number of data packets, probe responses, and beacons received by the wireless device.

* * * * *